US008318375B2

(12) United States Patent
Mailley et al.

(10) Patent No.: US 8,318,375 B2
(45) Date of Patent: Nov. 27, 2012

(54) CATHODE FOR ELECTROCHEMICAL REACTOR, ELECTROCHEMICAL REACTOR INCORPORATING SUCH CATHODES AND METHOD FOR MAKING SAID CATHODE

(75) Inventors: Sophie Mailley, Le Pin (FR); Frédéric Sanchette, Montferrat (FR); Stéphanie Thollon, Saint Nizier du Moucherotte (FR); Fabrice Emieux, Voreppe (FR)

(73) Assignee: Commissariat a l'Energie Atomique, Paris (FR)

( * ) Notice: Subject to any disclaimer, the term of this patent is extended or adjusted under 35 U.S.C. 154(b) by 372 days.

(21) Appl. No.: 12/179,793

(22) Filed: Jul. 25, 2008

(65) Prior Publication Data
US 2009/0029236 A1 Jan. 29, 2009

Related U.S. Application Data

(63) Continuation of application No. PCT/FR2007/050650, filed on Jan. 15, 2007.

(30) Foreign Application Priority Data

Feb. 3, 2006 (FR) ...................................... 06 50398

(51) Int. Cl.
H01M 4/36 (2006.01)
H01M 4/38 (2006.01)
H01M 4/48 (2010.01)
H01M 4/92 (2006.01)
H01M 8/10 (2006.01)
B05D 5/12 (2006.01)

(52) U.S. Cl. ..... 429/488; 427/123; 427/124; 427/126.1; 427/126.3; 427/115; 429/480; 429/481; 429/484; 429/485; 429/487

(58) Field of Classification Search ................... 429/44, 429/480, 481, 484, 485, 487, 488; 427/123, 427/124, 126.1, 126.3, 115
See application file for complete search history.

(56) References Cited

U.S. PATENT DOCUMENTS

| 4,316,944 | A | 2/1982 | Landsman et al. |
| 4,677,092 | A | 6/1987 | Luczak et al. |
| 6,673,127 | B1 | 1/2004 | Allen et al. |
| 2002/0034675 | A1* | 3/2002 | Starz et al. ..................... 429/42 |
| 2005/0282062 | A1* | 12/2005 | Manako et al. ................. 429/44 |
| 2007/0160899 | A1* | 7/2007 | Atanassova et al. ........... 429/44 |

FOREIGN PATENT DOCUMENTS

EP 0 872 906 A1 10/1998
(Continued)

OTHER PUBLICATIONS

Frohlich et al., Growth of SrTiO3 thin epitaxial films by aerosol MOCVD, May 1995, Thin Solid Films, 260, 187-191.*

(Continued)

*Primary Examiner* — Basia Ridley
*Assistant Examiner* — Sean P Cullen
(74) *Attorney, Agent, or Firm* — Burr & Brown

(57) ABSTRACT

A cathode for an electrochemical reactor including a diffusion layer and a catalyst layer. The cathode has bimetallic or multimetallic nanoparticles, dispersed in direct contact with the diffusion layer, at least one of the metals being chromium (Cr) wholly or partly in oxidized form. The cathode is fabricated by depositing the bimetallic or multimetallic nanoparticles on the diffusion layer by DLI-MOCVD in the presence of $O_2$.

5 Claims, 3 Drawing Sheets

FOREIGN PATENT DOCUMENTS

| | | |
|---|---|---|
| EP | 0 928 036 A1 | 7/1999 |
| EP | 1 175 948 A2 | 1/2002 |
| JP | 2004-283774 A1 | 10/2004 |
| WO | 99/53557 A1 | 10/1999 |
| WO | 03/015199 A1 | 2/2003 |
| WO | 2005/001967 A1 | 1/2005 |

OTHER PUBLICATIONS

Thollon et al., Pulsed liquid injection metalorganic chemical vapor deposition of metallic nanostructured catalysts. Evaluation of their deVOC catalytic propertics, May 2005, Meeting Abstracts—Electrochemical Society, 207th ECS Meeting, 87.*

Serp et al., Controlled-Growth of Platinum Nanoparticles on Carbon Nanotubes or Nanospheres by MOCVD in Fluidized Bed Reactor, Journal de Physique IV, 12, PR4-29.*

Serp et al., Controlled-Growth of Platinum Nanoparticles on Carbon Nanotubes or Nanospheres byMOCVD in Fluidized Bed Reactor, Jun. 2002, Journal de Physique IV, 12, PR4-29.*

G.A. Battiston et al., "*Platinum Nanoelectrodes Embedded in an Insulating Alumina Matrix: An Innovative Approach*," Chemical Vapor Deposition, vol. 11. No. 4, Apr. 2005, pp. 187-190.

M.K. Min et al., "*Particle Size and Alloying Effects of Pt-based Alloy Catalysts for Fuel Cell Applications*," Electrochimica Acta, vol. 45, No. 25-56, Aug. 31, 2000, pp. 4211-4217.

* cited by examiner

CATHODE FOR ELECTROCHEMICAL REACTOR, ELECTROCHEMICAL REACTOR INCORPORATING SUCH CATHODES AND METHOD FOR MAKING SAID CATHODE

FIELD OF THE INVENTION

The invention relates to the fabrication of active layers of electrode materials for electrochemical reactors, such as fuel cells and other storage batteries.

More precisely, the invention relates to a cathode for electrochemical reactor having a bi- or multimetallic active surface, for catalysing oxygen reduction reactions, in order to reduce the content of noble metals in the structure.

The direct immobilisation of dispersed nanoparticles on a nanoporous metal structure is carried out by co-deposition of metal particles or metal oxides on supports of gas diffusion layers, using the DLI-MOCVD (Direct Liquid Metal Organic Chemical Vapour Deposition) process.

This immobilisation of the catalyst directly in the matrix of the electrode material serves to limit the effects of loss of catalytic site caused by the inaccessibility of the gases or of the proton conductor, and by a choice of the co-metal, to improve the catalytic properties.

The invention therefore serves to reduce the costs incurred by high catalyst loads of noble metals and to increase the operating stability under a fuel from reforming.

BACKGROUND OF THE INVENTION

Technico-economic analyses of the viability of fuel cells of the PEMFC (Proton Exchange Membrane Fuel Cell) type show that the future of this technology will essentially be determined by the reduction of the cost per kW supplied by the cell and the service life of its components.

One of the parameters directly affecting the cost of the cell components stems from the catalyst. Most effective catalysts for low temperature cells are noble metals, such as platinum (Pt) or ruthenium (Ru), which are very costly.

Thus, it has been estimated that the cost of the catalysts in the PEMFC fuel cell accounts for 70 to 80% of the total value of the core of the cell.

The prior art, for the fabrication of electrode materials, recommends deposition by spray-coating, painting or coating of an ink consisting of metal catalyst particles supported on particles of carbon and of an organic solvent. Such electrodes are described for example in documents EP-A-0 872 906 and EP-A-0 928 036.

The use of catalyst particles immobilised on carbon serves to obtain nanometer sized catalyst particles while reducing the catalyst load. However, the method for fabricating particles supported by carbon generally requires high temperatures (T>300° C.), which cause the coalescence of the metal particles. Moreover, catalysts supported on carbon have the drawback of sometimes being lost in the nanometer sized pores of the carbon, making them inactive in the active layer of the electrode. The content of platinum deposited, constituting the optimised active layer, is about 0.35 mg/cm². This value is too high in terms of cost, and commercial analyses recommend platinum contents in the cell close to a value lower than 0.1 mg/cm².

Furthermore, considering the active layers using C/Pt, it is estimated that only 50 to 75% of the fixed platinum is electroactive. The loss of platinum activity is essentially due to fractures on the electron or proton conduction networks, the input of reactive species in the electrode material (gas diffusion network) and the inactivity of the catalyst particles lost in the pores of the carbon.

Fabrication methods by electrodeposition by CCVD (described in document WO 03/015199) or by ion-beam (described in document U.S. Pat. No. 6,673,127) have revealed the possibility of directly immobilising the catalyst on the surface of the materials of the diffusion layer to overcome the drawbacks of carbon-supported platinum spray deposits. However, these technologies produce unsatisfactory active layers, for example due to the excessive size of the particles or the insufficient penetration of these particles into the diffusion layer.

An obvious need therefore exists to produce catalyst layers for electrochemical reactors, and particularly for PEMFC fuel cells, serving to avoid immobilising high catalyst loads, which are liable to remain inaccessible to the proton conduction and gas diffusion network, or to block electron conduction.

SUMMARY OF THE INVENTION

In the context of the present invention, the Applicant turned towards another approach, that is reducing the platinum content in the active layer of a cathode by combining the action of the catalyst consisting of a noble metal with another metal having a weaker catalytic action or only playing a favourable role for the absorption of the species to be catalysed.

Thus and according to a first aspect, the invention relates to a cathode for electrochemical reactor having bimetallic or multimetallic nanoparticles, dispersed in direct contact with the diffusion layer, at least one of the metals being wholly or partly in oxidized form.

According to the invention, one of the metals is a strong catalyst of the noble metal type, advantageously platinum (Pt).

At least one other of the metals is a less costly metal, having a weaker catalytic activity or simply implicated in the capture of the species to be catalysed. Chromium (Cr) is particularly suitable for implementing the invention. The Cr is wholly or partly in oxidized form.

It is no doubt known in the art how to use chromium as catalyst for high temperature cells, or optionally in alloys. However, the chromium used was supported by carbon (Cf. WO 99/53557).

This combination serves to significantly reduce the platinum load to a value not exceeding 0.2 mg/cm², the cathodes thus produced having outstanding electrochemical properties.

The diffusion layer advantageously has a nanoporous structure. It preferably consists of porous carbon, optionally including proton conductors such as Nafion®. The porous carbon may be in the form of graphite or of nanotubes.

The catalyst layer consists of nanometer sized particles, having a diameter lower than 100 nm, preferably between 1 and 50 nm, intimately combining at least two metals.

Such structures have been obtained by employing the DLI-MOCVD process. Thus and according to a second aspect, the invention relates to a method for fabricating cathodes for electrochemical reactors having bimetallic or multimetallic nanoparticles, dispersed in direct contact with the diffusion layer, in which the step of depositing the catalyst on the diffusion layer is carried out by DLI-MOCVD.

Only this technology allows the satisfactory production of a structure in which the catalyst particles are directly fixed on the support of cathode material, the gas diffusion layer. Thus, the catalysis zone effectively corresponds to the area called the triple contact point, where the electron exchanges, the consumption of gas reactant and the transfer of ion species take place.

In this respect, FIG. 1 illustrates the advantage of this technology with the catalyst Pt alone, in comparison with platinum supported on carbon as described in the prior art.

Furthermore, and according to the invention, at least two metals are co-deposited by the DLI-MOCVD process.

The principle of DLI-MOCVD derives from the conventional CVD (Chemical Vapour Deposition) systems. The reactive species are provided in liquid form and injected at high pressure by injectors. Thus, starting with a dilute precursor solution, the product consumption is reduced and can be controlled in volume or in mass.

In practice, these bimetallic or multimetallic nanoparticles are synthesised by DLI-MOCVD at atmospheric pressure or under vacuum, with a deposition temperature of 400° C., or lower, using a mixture of precursors such as organometallics (type β-diacetonates, carboxylates) soluble in a common solvent (acetyl acetone, THF, etc.), or using a plurality of independent sources of precursors in various solvents, in the presence of a reaction gas mainly consisting of an oxidising reactant gas (for example $O_2$, $CO_2$, etc.) or a reducing gas ($H_2$).

This method is suitable for a high and controllable growth rate. Furthermore, it can be carried out with plasma enhancement for continuous control of the injected species.

The co-deposits produced by DLI-MOCVD offer a morphology suitable for bimetallic particles, in particular Pt—Cr, or multimetallic particles.

In fact, the deposit obtained by this technology may be in various forms depending on the mode of seeding and growth of the compounds involved. The use of high pressure injectors serves to have a specificity of the deposition morphology associated with the possibility of providing reactive species more rapidly. This morphology specificity is also related to the choice of substrate used.

More particularly, the chromium oxide formed by DLI-MOCVD deposition reveals a dense foam structure on the microporous substrate (FIG. 2).

On the other hand, the platinum deposit alone is in the form of nanometer sized metal islands (diameter 1 to 50 nm) well dispersed at the surface of the support (diffusion layer) with an interparticle distance of 1 to 50 nm (FIG. 3).

The simultaneous production of chromium and platinum oxide deposits substantially increases the geometric volume of the platinum catalyst particles in a 3D structure provided by the chromium oxide (FIG. 4). The intrinsic properties of chromium also serve to facilitate the adsorption of oxygen.

Characterisations by electrochemistry reveal a decrease in the electrode surge voltage for the oxidation reduction reaction (FIG. 5). The bimetallic or multimetallic structures according to the invention therefore serve to decrease the electrode surge voltage and improve the performance of the cell. This improves the kinetics of catalysis of the reduction of the oxygen electrode.

Due to the chemical nature of the deposited particles (noble metals and metal oxides) and the morphology of the deposits (large number of very well dispersed nanometer sized active sites), the active layers used in the context of the invention appear to be highly efficient for the electrocatalysis of the reaction generated in electrochemical reactors.

Fuel cells and storage batteries incorporating such cathodes are also part of the invention.

BRIEF DESCRIPTION OF THE DRAWINGS

The invention and the advantages thereof will appear more clearly from the exemplary embodiments that follow, in conjunction with the appended figures. However, these examples are not in any way limiting.

DETAILED DESCRIPTION OF THE INVENTION

The examples presented below were prepared using a vapour deposition device sold by JIPELEC under the name "Inject, Système d'injection et d'évaporation de précurseurs liquides purs ou sous forme de solutions", coupled with a chemical vapour deposition chamber.

The JIPELEC device comprises several parts: the storage tank for the chemical solution, an injector (petrol, diesel) connected to the liquid tank by a feed line and controlled by an electronic control device, a carrier gas feed line, and a vaporisation device (evaporator).

The deposition chamber, which contains the substrate to be coated, comprises a heating system, a gas feed and pumping and pressure control means.

The deposition chamber and the substrate are heated to a temperature above that of the evaporator, in order to create a positive thermal gradient. The chemical solution is introduced into the pressurised tank (2 bar in the present case), and sent via the injector or injectors by pressure differential into the evaporator. The injection flow rate is controlled for frequency and opening time by the injector.

For the deposition examples below, the platinum (Pt) nanoparticles were produced on commercial diffusion layer substrate of the ELAT type (E-Tek product, sold by De Nora). The chemical deposition solutions comprised organometallic precursors, respectively in toluene for $Cr(CO)_6$ and in xylene for Pt(COD). The temperatures of the evaporator and the substrate were set respectively at 140 and 290° C. The other operating conditions of the examples are given in Table I below:

TABLE I

Operating conditions applied for the tests

| | Concentration Mol/l | Injector Frequency (Hz); Inj 1 (Pt)/inj2 (Cr) | Injector Opening Time (ms) | $N_2/O_2$ Flow Rates (cc) | Pressure (Pas) | Deposition Time (min) |
|---|---|---|---|---|---|---|
| Test 1: Deposition of Pt alone | 0.025 | 2/0 | 2 | 40/160 | 800 | 30 |
| Test 2: Deposition of Cr alone | 0.02 | 0/4 | 2 | 40/160 | 800 | 30 |
| Test 3: Deposition of Pt—Cr | 0.025 M (Pt(COD)), 0.02 M (Cr(CO)$_6$) | 2/4 | 2 | 40/160 | 800 | 30 |

Figure 1:
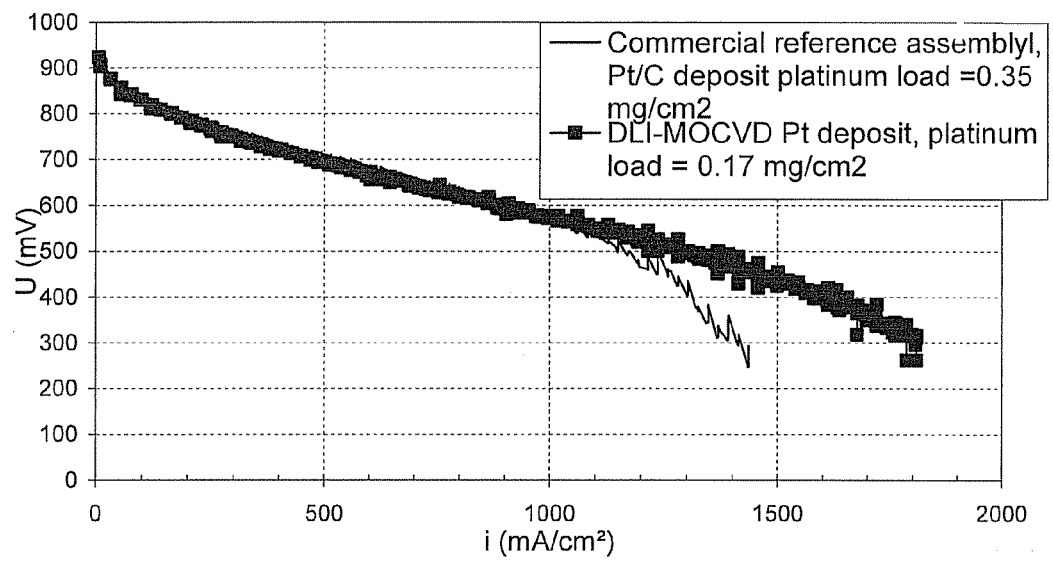
FIG. 1 shows a bias curve comparing the cell performance of an electrode with C/Pt and an electrode with platinum catalyst deposited by DLI-MOCVD.
Figure 2:
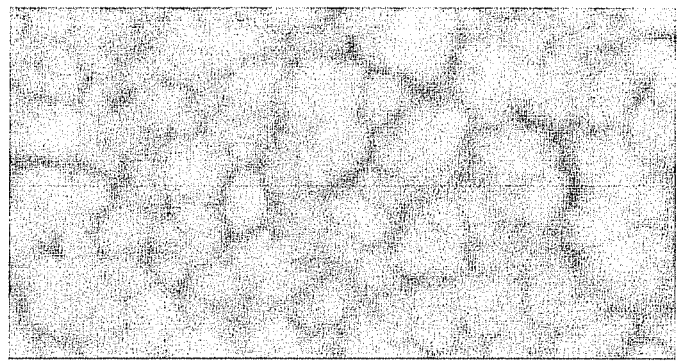
FIG. 2 is a microscopic image of the interface of the chromium deposit obtained by DLI-MOCVD on GDL E-tek.
Figure 3:
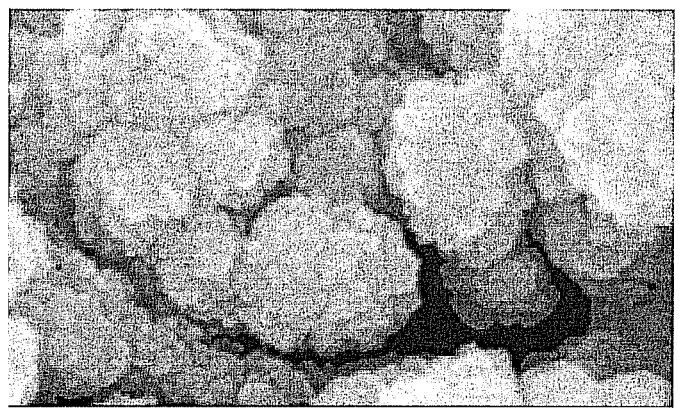
FIG. 3 is a microscopic image of the interface of an electrode modified by a Pt—Cr deposit by DLI-MOCVD on GDL E-tek.
Figure 4:
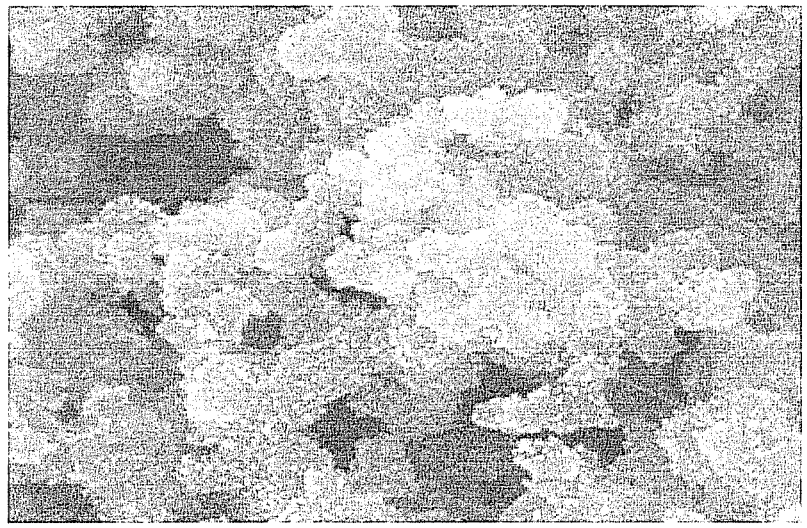
FIG. 4 is a microscopic image of the interface of an electrode modified by a Pt deposit on GDL E-tek.

The deposits produced by DLI-MOCVD on an E-tek diffusion layer were viewed under the microscope. The corresponding images are shown in FIGS. 2 (Cr, Test 2), 3 (Pt—Cr, Test 3) and 4 (Pt, Test 1), respectively.

Figure 5:
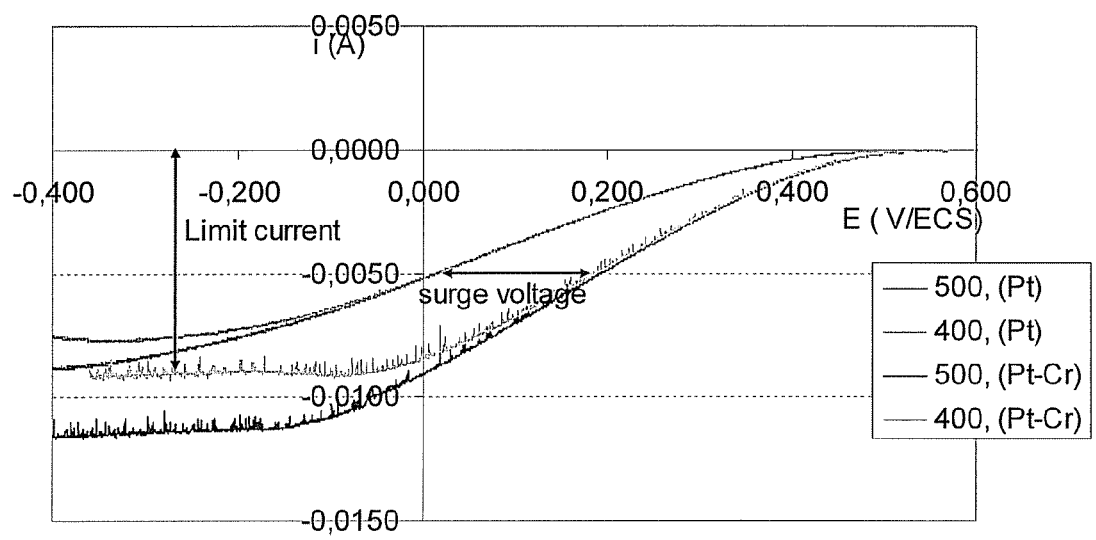
FIG. 5 shows bias curves of oxygen reduction performance of a Pt—Cr electrode and a Pt electrode.

The oxygen electrode reduction curves shown in FIG. 5 were plotted on the cathodes according to the invention, that is having a nanoporous metal structure incorporating nanodispersed nanometric particles of catalysts, deposited by the DLI-MOCVD process.

These curves reveal a decrease of 200 mV in the surge voltage of the oxygen electrode reduction reaction. The limit reaction current is higher on the bimetallic electrodes (Pt—Cr, Test 3), compared to the monometallic structure (Pt, Test 1). These results indicate a wider dispersion of the active noble catalyst and an improvement in the catalysis kinetics due to the presence of chromium oxide.

Figure 6:
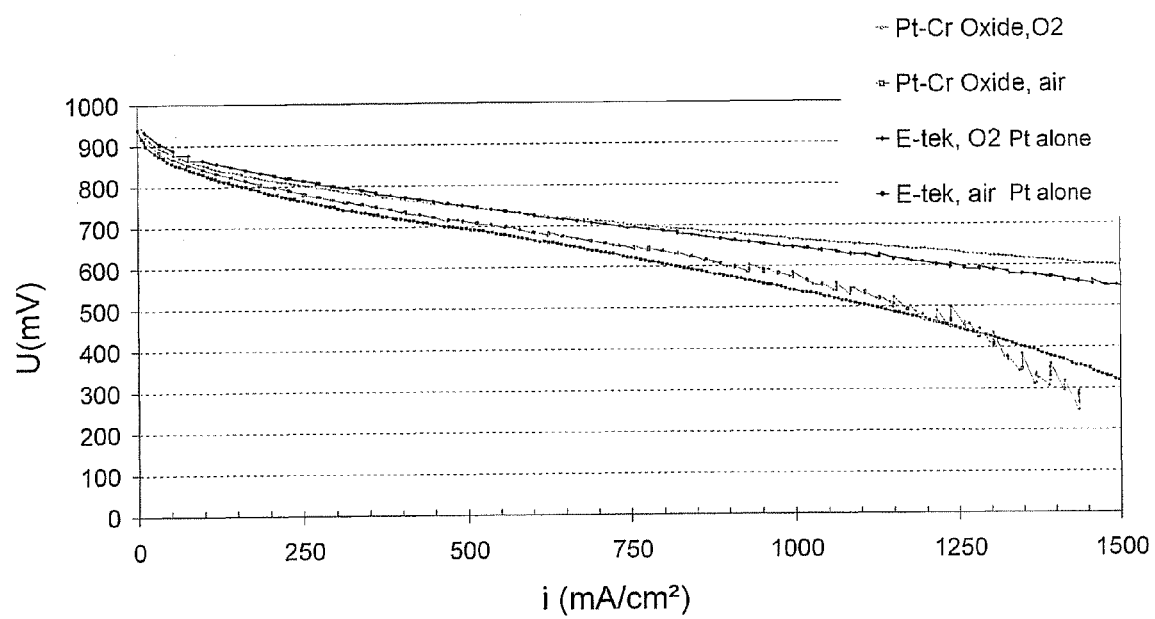
FIG. 6 shows cell performance of Pt or Pt—Cr oxide layers, deposited in air or in oxygen, used as cathodes.

FIG. 6 shows the results obtained with a cell for various layers used as cathode. It may be observed that the E-tek reference layers containing platinum alone, in the amount of 0.35 mg/cm$^2$, yield equivalent results to layers according to the invention, containing a mixture of chromium oxide and platinum in the amount of 0.089 mg/cm$^2$, and regardless of whether the deposition is made in air or in oxygen. The presence of chromium oxide therefore helps to significantly reduce the load of costly noble metal.

The invention claimed is:

1. A method for fabricating a cathode, comprising a diffusion layer and a catalyst layer, for an electrochemical reactor comprising a step of depositing bimetallic or multimetallic nanoparticles of the catalyst layer on the diffusion layer of the cathode by DLI-MOCVD in the presence of $O_2$ under a vacuum, wherein at least one of the metals of the bimetallic or multimetallic nanoparticles is wholly or partly oxidized chromium (Cr).

2. The method for fabricating a cathode for an electrochemical reactor according to claim 1, wherein the metals of the bimetallic or multimetallic nanoparticles of the catalyst layer are co-deposited.

3. The method for fabricating a cathode for an electrochemical reactor according to claim 2, wherein metal precursors of the bimetallic or multimetallic nanoparticles are dissolved in solvents.

4. The method for fabricating a cathode for an electrochemical reactor according to claim 1, wherein the catalyst layer is deposited at a temperature lower than 400° C.

5. The method for fabricating a cathode for an electrochemical reactor according to claim 1, wherein the DLI-MOCVD step is plasma enhanced.

* * * * *